United States Patent
Okazaki et al.

(10) Patent No.: US 10,863,613 B2
(45) Date of Patent: Dec. 8, 2020

(54) EUV LIGHT GENERATOR

(71) Applicant: Gigaphoton Inc., Tochigi (JP)

(72) Inventors: Shinji Okazaki, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/560,611

(22) Filed: Sep. 4, 2019

(65) Prior Publication Data
US 2019/0394868 A1 Dec. 26, 2019

Related U.S. Application Data

(63) Continuation of application No. PCT/JP2017/016542, filed on Apr. 26, 2017.

(51) Int. Cl.
*H05H 7/06* (2006.01)
*G03F 7/20* (2006.01)
*H05H 7/04* (2006.01)

(52) U.S. Cl.
CPC ........... *H05H 7/06* (2013.01); *G03F 7/70033* (2013.01); *H05H 7/04* (2013.01); *H05H 2007/041* (2013.01); *H05H 2007/046* (2013.01)

(58) Field of Classification Search
None
See application file for complete search history.

(56) References Cited

U.S. PATENT DOCUMENTS

| | | | |
|---|---|---|---|
| 2003/0117601 A1 | 6/2003 | Kudo | |
| 2005/0175042 A1 | 8/2005 | Hajima | |
| 2009/0080085 A1 | 3/2009 | Botma | |
| 2009/0080478 A1 | 3/2009 | Burkert et al. | |
| 2010/0012864 A1* | 1/2010 | Smith | H01J 3/40 250/506.1 |
| 2010/0074400 A1* | 3/2010 | Sendai | G21K 1/10 378/37 |

(Continued)

FOREIGN PATENT DOCUMENTS

| JP | H03-211817 A | 9/1991 |
|---|---|---|
| JP | H05-114548 A | 5/1993 |

(Continued)

OTHER PUBLICATIONS

Kensei Umemori, "Current Progress on Design Work of High Power EUV-FEL based on ERL," 2015 International Workshop on EUV and Soft X-Ray Source, Workshop Proceedings, Nov. 11, 2015, S22, all pages.

(Continued)

*Primary Examiner* — Amy Cohen Johnson
*Assistant Examiner* — Jianzi Chen
(74) *Attorney, Agent, or Firm* — Studebaker & Brackett PC

(57) ABSTRACT

An EUV light generator including the following components: A. an electron storage ring including a first linear section and a second linear section; B. an electron supplier configured to supply the electron storage ring with an electron bunch; C. a high-frequency acceleration cavity disposed in the first linear section and configured to accelerate the electron bunch in such a way that a length Lez of the electron bunch satisfies "0.09 m≤Lez≤3 m;" and D. an undulator disposed in the second linear section and configured to output EUV light when the electron bunch enters the undulator.

15 Claims, 11 Drawing Sheets

(56) References Cited

U.S. PATENT DOCUMENTS

| | | | | |
|---|---|---|---|---|
| 2016/0225477 A1* | 8/2016 | Banine | | H05H 7/04 |
| 2016/0226212 A1* | 8/2016 | Tajima | | H05G 2/00 |
| 2016/0301180 A1* | 10/2016 | Nikipelov | | H01J 1/34 |
| 2017/0149198 A1 | 5/2017 | Wakabayashi et al. | | |
| 2018/0241172 A1* | 8/2018 | Ruth | | G03F 7/70025 |

FOREIGN PATENT DOCUMENTS

| | | |
|---|---|---|
| JP | H09-232693 A | 9/1997 |
| JP | H09-288251 A | 11/1997 |
| JP | 2005-228489 A | 8/2005 |
| JP | 2009-076906 A | 4/2009 |
| JP | 2009-081438 A | 4/2009 |
| JP | 2012-215905 A | 11/2012 |
| WO | 2016051518 A1 | 4/2016 |

OTHER PUBLICATIONS

International Search Report issued in PCT/JP2017/016542; dated Jul. 25, 2017.
International Preliminary Report on Patentability and Written Opinion issued in PCT/JP2017/016542; dated Oct. 29, 2019.

* cited by examiner

EUV LIGHT GENERATOR

CROSS REFERENCE TO RELATED APPLICATIONS

The present application is a continuation application of International Application No. PCT/JP2017/016542 filed on Apr. 26, 2017. The content of the application is incorporated herein by reference in its entirety.

BACKGROUND

1. Technical Field

The present disclosure relates to an EUV light generator.

2. Related Art

In recent years, miniaturization of the semiconductor processes is accompanied by rapid progress in miniaturization of a transfer pattern in optical lithography in the semiconductor processes. In the next-generation semiconductor processes, microfabrication of a feature ranging from 70 to 45 nm, even microfabrication of a feature smaller than or equal to 32 nm will be required. To this end, for example, to meet a requirement of microfabrication of a feature smaller than or equal to 16 nm, it is expected to develop an exposure apparatus that is the combination of an extreme ultraviolet light generator for generating extreme ultraviolet (EUV) light having a wavelength of about 13 nm and reduced projection reflective optics.

As the EUV light generator, the following three apparatuses have been proposed: an apparatus based on laser produced plasma (LPP) using plasma produced by irradiation of a target substance with laser light; an apparatus based on discharge produced plasma (DPP) using plasma produced by discharge; and a free-electron laser apparatus using electrons output from an electron accelerator.

CITATION LIST

Patent Literature

[PTL 1] JP-A-5-114548
[PTL 2] JP-A-2005-228489
[PTL 3] WO 2016/051518

SUMMARY

An EUV light generator according to a viewpoint of the present disclosure includes the following components:

A. an electron storage ring including a first linear section and a second linear section;
B. an electron supplier configured to supply the electron storage ring with an electron bunch;
C. a high-frequency acceleration cavity disposed in the first linear section and configured to accelerate the electron bunch in such a way that a length Lez of the electron bunch satisfies Expression (a) below:

$$0.09 m \leq Lez \leq 3 m \qquad (a); \text{ and}$$

D. an undulator disposed in the second linear section and configured to output EUV light when the electron bunch enters the undulator.

An EUV light generator according to another viewpoint of the present disclosure includes the following components:

A. an electron storage ring including a first linear section and a second linear section;
B. an electron supplier configured to supply the electron storage ring with an electron bunch;
C. a high-frequency acceleration cavity disposed in the first linear section and configured to accelerate the electron bunch and include a plurality of cell cavities having substantially a same length, with a length La of each of the cell cavities satisfying Expression (k) below:

$$0.18 m \leq La \leq 6 m \qquad (k); \text{ and}$$

D. an undulator disposed in the second linear section and configured to output EUV light when the electron bunch enters the undulator.

An EUV light generator according to another viewpoint of the present disclosure includes the following components:

A. an electron storage ring including a plurality of linear sections;
B. an electron supplier configured to supply the electron storage ring with an electron bunch;
C. a high-frequency acceleration cavity disposed in one of the linear sections and configured to accelerate the electron bunch; and
D. undulators disposed in at least two of the linear sections and configured to each output EUV light when the electron bunch enters the undulator.

BRIEF DESCRIPTION OF THE DRAWINGS

Embodiments of the present disclosure will be described below only by way of example with reference to the accompanying drawings.

DETAILED DESCRIPTION

Contents

Figure 1:
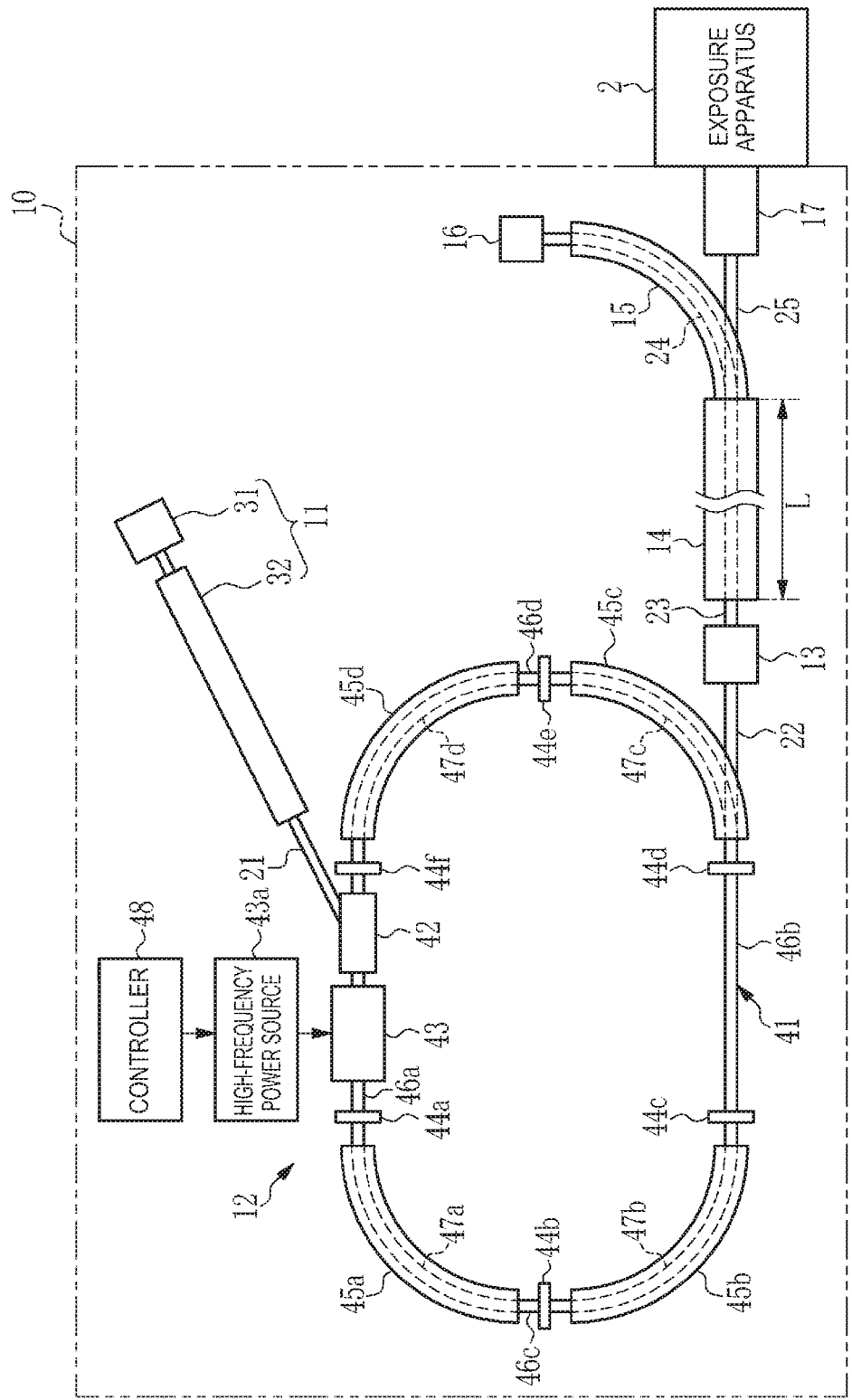
FIG. 1 schematically shows the configuration of an EUV light generator 10 according to Comparative Example.

1. Comparative Example
1.1 Configuration
1.1.1 Overall configuration of EUV light generator
1.1.2 Light transmission system
1.2 Operation
1.2.1 Overall operation of EUV light generator
1.2.2 Operation of light transmission system
1.3 Problems
2. First Embodiment
2.1 Configuration
2.2 Operation
2.3 Effects
2.4 High-frequency acceleration cavity
2.4.1 Configuration
2.4.2 Operation
2.5 Undulator
2.5.1 Configuration and operation
2.6 Electron generator
2.6.1 Configuration
2.6.2 Operation
2.7 Light transmission system
2.7.1 Configuration
2.7.2 Operation
2.7.3 Effects
3. Second Embodiment
3.1 Configuration
3.2 Operation
3.3 Effects
3.4 Convergence magnets
3.4.1 Configuration
3.4.2 Operation
3.5 Variation of electron generator
3.5.1 Configuration
3.5.2 Operation
3.5.3 Effects
4. Third Embodiment
4.1 Configuration
4.2 Operation
4.3 Effects
4.4 Variations Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparative Example 1.1 Configuration
1.1.1 Overall Configuration of EUV Light Generator FIG. 1 shows an overall configuration of an EUV light generator 10. The EUV light generator 10 includes an electron supplier 11, an electron storage ring 12, an electron bunch compressor 13, an undulator 14, a deflection magnet 15, an electron damper 16, and a light transmission system 17, as shown in FIG. 1. The EUV light generator 10 further includes first to fourth electron tubes 21 to 24 and an optical path tube 25. The EUV light generator 10 is configured as a free-electron laser apparatus (FEL) and connected to an exposure apparatus 2. The first to fourth electron tubes 21 to 24 are made of stainless steel.

The electron supplier 11 includes an electron generator 31, which generates an electron bunch that is a lump containing a large number of electrons, and an electron accelerator 32, which accelerates the electron bunch generated by the electron generator 31. The electron accelerator 32 is connected to the electron storage ring 12 via the first electron tube 21.

The electron storage ring 12 includes a ring-shaped tube 41, an inflector 42, a high-frequency acceleration cavity 43, first to sixth convergence magnets 44a to 44f, and first to fourth deflection magnets 45a to 45d. The tube 41 has first to fourth linear sections 46a to 46d and first to fourth curved sections 47a to 47d. The first to fourth deflection magnets 45a to 45d are disposed in the first to fourth curved sections 47a to 47d, respectively. The electron storage ring 12 is configured to cause the electron bunch to circulate through the tube 41. The sections of the tube 41 are made of stainless steel.

The inflector 42, the high-frequency acceleration cavity 43, the first convergence magnet 44a, and the sixth convergence magnet 44f are disposed in the first linear section 46a. The second convergence magnet 44b is disposed in the third linear section 46c. The third convergence magnet 44c and the fourth convergence magnet 44d are disposed in the second linear section 46b. The fifth convergence magnet 44e is disposed in the fourth linear section 46d.

The first electron tube 21 is connected to the inflector 42. The inflector 42 inflects the orbit of the electron bunch incident thereon from the electron accelerator 32 via the first electron tube 21 to cause the electron bunch to enter the tube 41 of the electron storage ring 12. A high-frequency power source 43a is connected to the high-frequency acceleration cavity 43. A controller 48 is connected to the high-frequency power source 43a. The high-frequency acceleration cavity 43 is so configured that energy is imparted to the electron bunch circulating through the tube 41 to accelerate the electron bunch, and that the electron bunch has a length Lez of about 0.06 m. The length Lez is the length along the traveling direction of the electron bunch.

The first to sixth convergence magnets 44a to 44f cause the electron bunch beam to converge in such a way that the electron bunch passes through the center of the tube 41. The first to fourth deflection magnets 45a to 45d deflect the orbit of the electron bunch in such a way that the electron bunch passes through the interiors of the first to fourth curved sections 47a to 47d.

A second electron tube 22 has one end so connected to part of the tube 41 that part of the electron bunch is extracted from the electron storage ring 12. The other end of the second electron tube 22 is connected to the electron bunch compressor 13. The electron bunch compressor 13 is, for example, a compressor that compresses the electron bunch by creating a difference in speed between the front and rear portions of the electron bunch. The electron bunch compressor 13 is configured, for example, to compress the length of the electron bunch to a value ranging from about 0.06 to 0.00003 m.

The third electron tube 23 has a linear shape, is inserted through the interior of the undulator 14, and has one end connected to the electron bunch compressor 13. The undulator 14 has a length L ranging from about 50 to 200 m. The undulator 14 includes a plurality of magnets with the S poles and the N poles thereof alternately arranged in two rows and the S poles in one row facing the N poles in the other row. The plurality of magnets provided in the undulator 14 are so disposed that the electron bunch outputs EUV light having a wavelength of 13.5 nm while traveling in a serpentine manner through the undulator 14.

The fourth electron tube 24 is a curved tube and has one end connected to the other end of the third electron tube 23, and the other end of the fourth electron tube 24 is connected to the electron damper 16. The deflection magnet 15 is disposed in the fourth electron tube 24. The deflection magnet 15 deflects the orbit of the electron bunch output from the undulator 14 and guides the electron bunch to the electron damper 16 via the fourth electron tube 24. The electron damper 16 is configured to discard the electron bunch that enters the electron damper 16 via the fourth electron tube 24.

The optical path tube 25 is so disposed that the EUV light generated by the undulator 14 enters the optical path tube 25. The optical path tube 25 guides the EUV light having entered from the undulator 14 to the light transmission system 17. The light transmission system 17 transmits the EUV light having entered the light transmission system 17 via the optical path tube 25 to the exposure apparatus 2.

1.1.2 Light Transmission System

Figure 2:
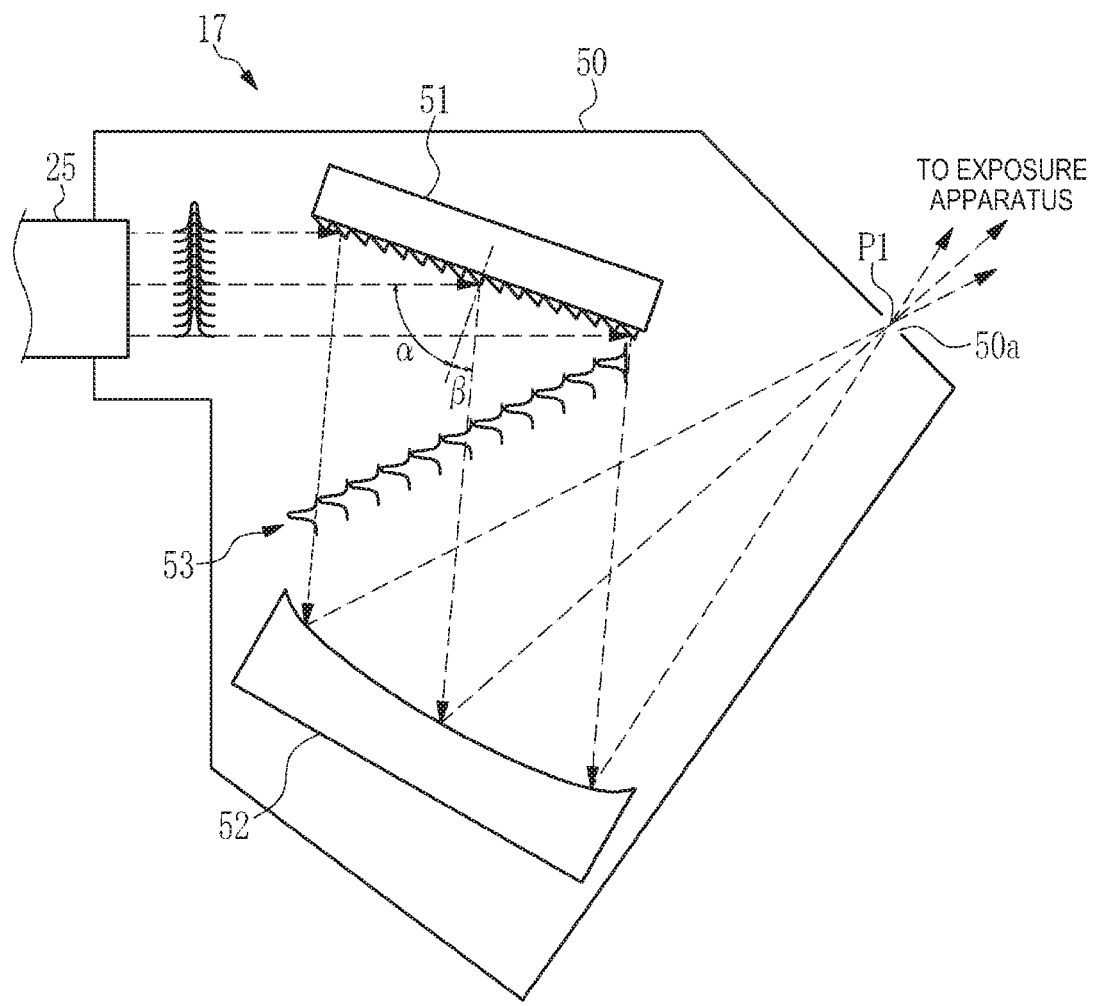
FIG. 2 schematically shows an example of the configuration of a light transmission system 17.

FIG. 2 schematically shows an example of the configuration of the light transmission system 17. The light transmission system 17 includes a chamber 50, a grating 51, which functions as a pulse stretcher, and an off-axis paraboloid mirror 52. The grating 51 diffracts the EUV light incident via the optical path tube 25 to generate diffracted light 53.

The grating 51 is disposed in the optical path between the optical path tube 25 and the off-axis paraboloid mirror 52 in the chamber 50. The grating 51 is so disposed that the EUV light having entered the chamber 50 via the optical path tube 25 is incident on the grating 51 at a predetermined angle of incidence a. The base material of the grating 51 contains a metal material having high thermal conductivity, for example, any of Cu, Al, and Si. The grating 51 has, for example, triangular-wave-shaped grooves.

The off-axis paraboloid mirror 52 is so disposed in the chamber 50 that the diffracted light 53 generated by the grating 51 is incident on the off-axis paraboloid mirror 52 at a predetermined angle and the diffracted light 53 reflected off the off-axis paraboloid mirror 52 enters the exposure apparatus 2 with the reflected light collected into a spot.

The chamber 50 has a through hole 50a, through which the EUV light reflected off and collected by the off-axis paraboloid mirror 52 passes. The portion between the through hole 50a and the input side of the exposure apparatus 2 is sealed by a seal member that is not shown. The interior of the chamber 50 is exhausted by an exhausting apparatus that is not shown to a state close to a vacuum so that attenuation of the EUV light is suppressed.

1.2 Operation 1.2.1 Overall Operation of EUV Light Generator

The operation of the EUV light generator 10 according to Comparative Example will next be described. In the electron supplier 11, when the electron generator 31 generates the electron bunch, the electron bunch is accelerated by the electron accelerator 32. The inflector 42 inputs the electron bunch accelerated by the electron accelerator 32 into the first linear section 46a of the tube 41 of the electron storage ring 12. The length Lez of the electron bunch generated by the electron supplier 11 is, for example, about 0.06 m.

The electron bunch input into the electron storage ring 12 is accelerated by the high-frequency acceleration cavity 43, for example, to have a speed close to the speed of light with the electron bunch having the length Lez of about 0.06 m. The electron bunch spatially spreads in the high-frequency acceleration cavity 43. The electron bunch output from the high-frequency acceleration cavity 43 is caused to converge by the first convergence magnet 44a and input into the first curved section 47a.

The orbit of the electron bunch input into the first curved section 47a is deflected by 90° by the first deflection magnet 45a, and the deflected electron bunch is input into the third linear section 46c. The electron bunch spatially spreads in the first curved section 47a. The electron bunch is caused to converge by the second convergence magnet 44b and input into the second curved section 47b in the third linear section 46c. The orbit of the electron bunch input into the second curved section 47b is deflected by 90° by the second deflection magnet 45b, and the deflected electron bunch is input into the second linear section 46b.

In the second linear section 46b, the electron bunch input from the second curved section 47b is caused to converge by the third convergence magnet 44c. The electron bunch caused to converge by the third convergent magnet 44c travels through the second linear section 46b, where the electron bunch spatially spreads, and the electron bunch is caused to converge again by the fourth convergence magnet 44d. Part of the electron bunch caused to converge by the fourth convergence magnet 44d is input into the second electron tube 22.

The electron bunch input into the second electron tube 22 is input into the electron bunch compressor 13, and the electron bunch compressor 13 compresses the electron bunch into an electron bunch having a length Lez ranging from about 0.06 to 0.00003 m. The electron bunch compressed by the electron bunch compressor 13 is input into the third electron tube 23.

The electron bunch input into the third electron tube 23 travels in the third electron tube 23 in a serpentine manner under the influence of the undulator 14. The electron bunch traveling in a serpentine manner outputs EUV light. The EUV light enters the optical path tube 25. The EUV light has the wavelength of about 13.5 nm and a pulse width of about 10 femto-seconds. The kinetic energy of the electron bunch having output the EUV light decreases, and the electron bunch is decelerated accordingly.

On the other hand, the electron bunch output from the undulator 14 is input into the fourth electron tube 24. The electron bunch input into the fourth electron tube 24 is deflected by the deflection magnet 15 and enters the electron damper 16. The electron bunch having entered the electron damper 16 is damped by the electron damper 16.

The EUV light having entered the optical path tube 25 enters the light transmission system 17. In the light transmission system 17, the pulse width of the EUV light is expanded, so that the coherence of the EUV light is reduced, and the resultant EUV light enters the exposure apparatus 2 as pulsed laser light.

Out of the electron bunch caused to converge by the fourth convergence magnet 44d, the remainder that has not entered the second electron tube 22 is input into the third curved section 47c. The orbit of the electron bunch input into the third curved section 47c is deflected by 90° by the third deflection magnet 45c, and the deflected electron bunch is input into the fourth linear section 46d. In the fourth linear section 46d, the electron bunch is caused to converge by the fifth convergence magnet 44e, and the convergent electron bunch is input into the fourth curved section 47*d*. The orbit of the electron bunch input into the fourth curved section 47*d* is deflected by 90° by the fourth deflection magnet 45*d*, and the deflected electron bunch is input into the first linear section 46*a* again. The electron bunch input into the first linear section 46*a* is caused to converge by the sixth convergence magnet 44*f*.

The electron bunch having circulated through the tube 41 of the electron storage ring 12 and therefore having a reduced speed is input into the high-frequency acceleration cavity 43 and accelerated again to have the speed close to the speed of light. The accelerated electron bunch has the length Lez of about 0.06 m.

Part of the electron bunch is output to the second electron tube 22 whenever the electron bunch circulates through the electron storage ring 12. The electron supplier 11 therefore supplies the electron bunch circulating through the electron storage ring 12 with electrons via the inflector 42 to compensate the charge output to the second electron tube 22.

1.2.2 Operation of Light Transmission System

The operation of the light transmission system 17 on the EUV light will next be described. The EUV light is output via the optical path tube 25, as shown in FIG. 2. The EUV light output via the optical path tube 25 is obliquely incident on the grating 51 at the angle of incident c and diffracted by the grating 51 at an angle of diffraction β. The diffracted light 53, which is formed of a plane wave, is thus generated.

The EUV light diffracted by the grating 51 forms EUV light rays having different optical path lengths in accordance with the positions where the EUV light is diffracted by the grating 51. As a result, the diffracted light 53 is formed of pulses having different timings determined by the positions where the EUV light is diffracted by the grating 51. The diffracted light 53 containing a plurality of pulses that differ from one another in time is therefore incident on the off-axis paraboloid mirror 52. The diffracted light 53 is collected by the off-axis paraboloid mirror 52 into a spot in the vicinity of a predetermined light collection point P1.

Figure 3:
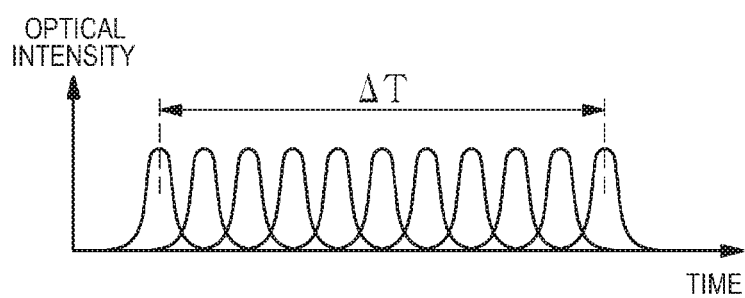
FIG. 3 diagrammatically shows a delay period ΔT of EUV light in the vicinity of a light collection point P1.

FIG. 3 diagrammatically shows a delay period ΔT of the EUV light in the vicinity of the light collection point P1. The horizontal axis of FIG. 3 represents time, and the vertical axis of FIG. 3 represents the optical intensity. Since the diffracted light 53 containing the plurality of pulses that differ from one another in time is collected into a spot by the off-axis paraboloid mirror 52 in the vicinity of the light collection point P1, the pulse width of the EUV light is expanded, so that the coherence of the EUV light is reduced, as shown in FIG. 3.

1.3 Problems

Problems of the EUV light generator 10 according to Comparative Example will next be described. In the EUV light generator 10, the EUV light generated by the undulator 14 is single-mode light having the short pulse width of about 10 femto-seconds and having high coherency. When the EUV light formed of the ultra-short pulses is directly supplied to the exposure apparatus 2, abrasion occurs on the reflection surface of each optical element provided in the exposure apparatus 2 and a resist formed on a wafer to be exposed to light. Further, when the high-coherence EUV light is supplied to the exposure apparatus 2, speckles occur when the image of a mask is transferred onto the wafer.

It is therefore necessary to expand the pulse width of the EUV light into a pulse width that can suppress abrasion or speckles. The grating 51 provided in the light transmission system 17 has the function as a pulse stretcher that expands the pulse width of the EUV light into the pulse width that can suppress abrasion or speckles to achieve low coherency.

The EUV light transmission efficiency of the grating 51 is, however, as low as 25% or lower. Therefore, in the EUV light generator 10 according to Comparative Example, there has been a problem that the EUV light from the undulator 14 is supplied to the exposure apparatus 2 with the power of the EUV light greatly attenuated by the light transmission system 17. For example, even when the power of the EUV light from the undulator 14 is 4 kW, the power is attenuated to about 1 kW.

Further, in the EUV light generator 10 according to Comparative Example, which generates EUV light, the undulator 14 needs to have a length ranging from about 50 to 200 m, resulting in a large EUV light generator, and reduction in size of the EUV light generator is a challenge. Moreover, in the EUV light generator 10 according to Comparative Example, the electron bunch output from the undulator 14 needs to be received by the electron damper 16, and how to process a resultant radioactive substance poses a problem.

2. First Embodiment

An EUV light generator 10*a* according to a first embodiment of the present disclosure will next be described. In the following description, substantially the same components as those of the EUV light generator 10 according to Comparative Example shown in FIGS. 1 and 2 have the same reference characters and will not be described as appropriate.

2.1 Configuration

Figure 4:
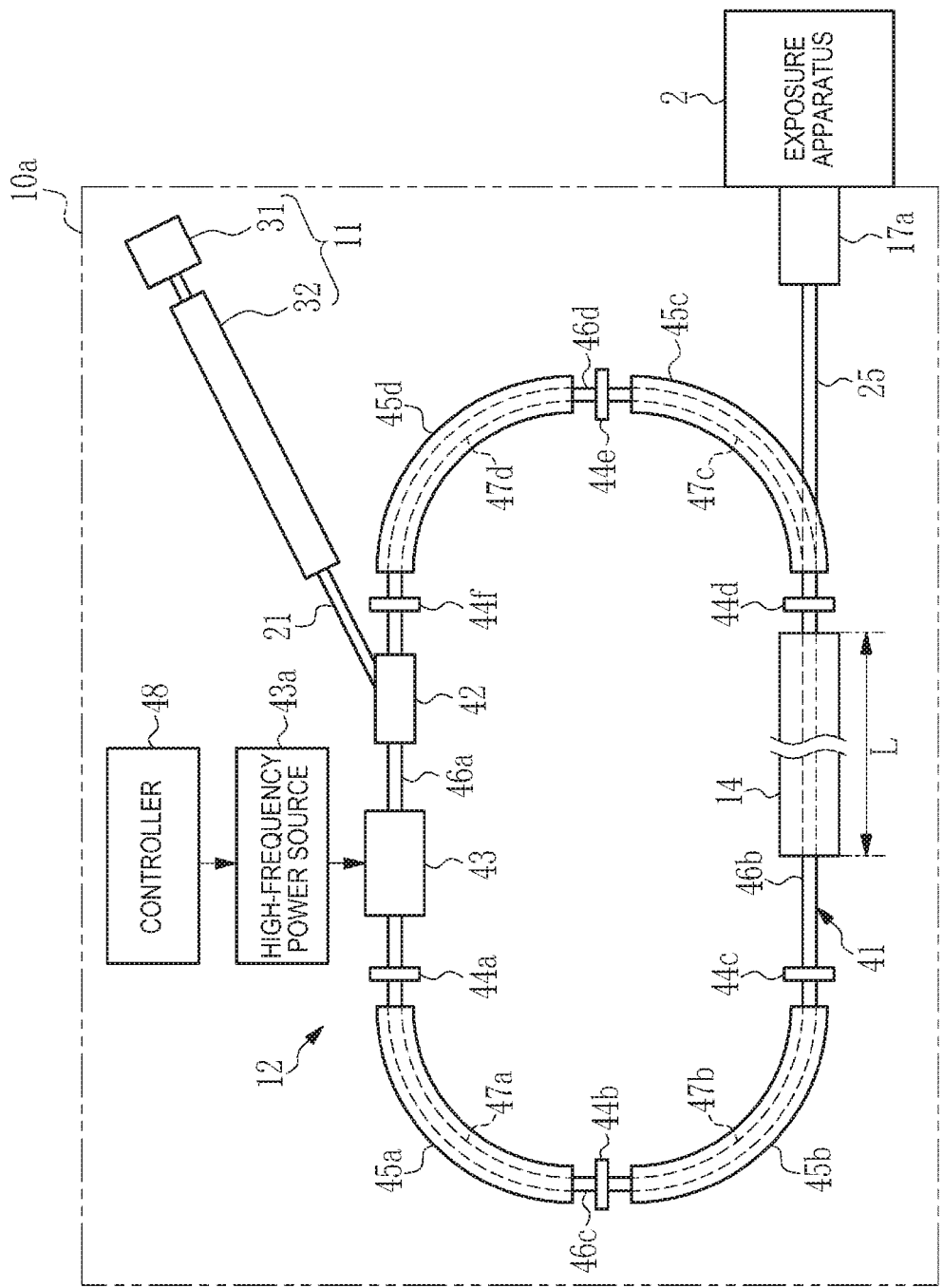
FIG. 4 schematically shows the configuration of an EUV light generator 10a according to a first embodiment.

FIG. 4 schematically shows the configuration of the EUV light generator 10*a* according to the first embodiment. The EUV light generator 10*a* differs from the EUV light generator 10 according to Comparative Example in that the undulator 14 is disposed in the electron storage ring 12, as shown in FIG. 4. Specifically, the undulator 14 is disposed in the second linear section 46*b* of the tube 41.

Further, the EUV light generator 10*a* is provided with no electron bunch compressor 13, second to fourth electron tubes 22 to 24, deflection magnet 15, or electron damper 16 shown in Comparative Example. In the EUV light generator 10*a*, the optical path tube 25 is connected to the second linear section 46*b* of the tube 41 of the electron storage ring 12.

In the present embodiment, the EUV light generator 10*a* is so configured that the length Lez of the electron bunch circulating through the electron storage ring 12 satisfies Expression (1) below.

$$0.09\,m \leq Lez \leq 3\,m \tag{1}$$

In the present embodiment, the electron generator 31 provided in the electron supplier 11 includes a pulsed laser apparatus 85, which irradiates a photocathode 81 with ultraviolet pulsed laser light PL to generate an electron bunch. The electron generator 31 in the first embodiment will be described later in detail with reference to FIG. 9. The full-width-at-half-maximum value of a pulse width Wp of the pulsed laser light PL output from the pulsed laser apparatus 85 is so adjusted as to satisfy Expression (2) below so that the length Lez of the electron bunch satisfies Expression (1) described above:

$$0.3\,ns \leq Wp \leq 10\,ns \tag{2}$$

The high-frequency acceleration cavity 43 includes a plurality of cell cavities 60 connected in series to each other. The high-frequency acceleration cavity 43 in the first embodiment will be described later in detail with reference to FIG. 5. To cause the electron bunch to circulate with the length Lez described above maintained, a length La of each of the cell cavities 60 needs to be about twice the length Lez. The length La of each of the cell cavities 60 is therefore configured to satisfy Expression (3) below.

$$0.18 \ m \leq La \leq 6 \ m \quad (3)$$

It is further preferable in the EUV light generator 10a that the full-width-at-half-maximum value of the length Lez of the electron bunch circulating through the electron storage ring 12 is configured to satisfy Expression (1a) below.

$$0.09 \ m \leq Lez \leq 0.9 \ m \quad (1a)$$

In this case, it is further preferable that the full-width-at-half-maximum value of the pulse width Wp of the pulsed laser light PL output from the pulsed laser apparatus 85 provided in the electron generator 31 is so adjusted as to satisfy Expression (2a) below.

$$0.3 \ ns \leq Wp \leq 3 \ ns \quad (2a)$$

In this case, it is further preferable that the length La of each of the cell cavities 60 of the high-frequency acceleration cavity 43 is configured to satisfy Expression (3a) below.

$$0.18 \ m \leq La \leq 1.8 \ m \quad (3a)$$

In the present embodiment, the length L of the undulator 14 is configured to satisfy Expression (4) below. The undulator 14 has the same configuration as that in Comparative Example except the length thereof.

$$15 \ m \leq L \leq 30 \ m \quad (4)$$

A light transmission system 17a is connected to the output side of the undulator 14 via the optical path tube 25. The light transmission system 17a includes, for example, one EUV light collection mirror. The light transmission system 17a includes no optical element that functions as a pulse stretcher, such as a grating, unlike in Comparative Example.

The tube 41 of the electron storage ring 12 is made of copper, which has high thermal conductivity, and cooled by a cooler that is not shown. The current value of the electron bunch circulating through the electron storage ring 12 is thus allowed to fall within a range from 10 to 20 A.

2.2 Operation

The operation of the EUV light generator 10a according to the first embodiment will next be described. In the electron supplier 11, when the electron generator 31 generates the electron bunch, the electron bunch is accelerated by the electron accelerator 32, and the inflector 42 inputs the electron bunch into the first linear section 46a of the tube 41 of the electron storage ring 12. The length Lez of the electron bunch generated by the electron supplier 11 satisfies Expression (1) described above.

The electron bunch input into the electron storage ring 12 is accelerated by the high-frequency acceleration cavity 43, for example, to have a speed close to the speed of light with the electron bunch having the length Lez that satisfies Expression (1) described above. The electron bunch output from the high-frequency acceleration cavity 43 is caused to converge by the first convergence magnet 44a and input into the first curved section 47a.

The orbit of the electron bunch input into the first curved section 47a is deflected by 90° by the first deflection magnet 45a, and the deflected electron bunch is input into the third linear section 46c. In the third linear section 46c, the electron bunch is caused to converge by the second convergence magnet 44b and input into the second curved section 47b. The orbit of the electron bunch input into the second curved section 47b is deflected by 90° by the second deflection magnet 45b, and the deflected electron bunch is input into the second linear section 46b.

In the second linear section 46b, the electron bunch input from the second curved section 47b is caused to converge by the third convergence magnet 44c and enters the undulator 14. In the undulator 14, the electron bunch having the length Lez that satisfies Expression (1) described above travels in a serpentine manner and outputs EUV light having the wavelength of about 13.5 nm. Since the electron bunch has the length Lez that satisfies Expression (1) described above and has a speed close to the speed of light, the full-width-at-half-maximum value of the pulse width of the EUV light ranges from about 0.3 to 10 ns. The kinetic energy of the electron bunch having output the EUV light decreases, and the electron bunch is decelerated accordingly.

The EUV light generated by the undulator 14 enters the light transmission system 17a via the optical path tube 25. The EUV light having entered the light transmission system 17a is reflected off the EUV light collection mirror and enters the exposure apparatus 2.

The electron bunch output from the undulator 14 is caused to converge by the fourth convergence magnet 44d and enters the third curved section 47c. The orbit of the electron bunch input into the third curved section 47c is deflected by 90° by the third deflection magnet 45c, and the deflected electron bunch is input into the fourth linear section 46d. In the fourth linear section 46d, the electron bunch is caused to converge by the fifth convergence magnet 44e, and the convergent electron bunch is input into the fourth curved section 47d. The orbit of the electron bunch input into the fourth curved section 47d is deflected by 90° by the fourth deflection magnet 45d, and the deflected electron bunch is input into the first linear section 46a again. The electron bunch input into the first linear section 46a is caused to converge by the sixth convergence magnet 44f.

The electron bunch having circulated through the tube 41 of the electron storage ring 12 and therefore having a reduced speed is input into the high-frequency acceleration cavity 43 and accelerated again to have the speed close to the speed of light. The length Lez of the accelerated electron bunch satisfies Expression (1) described above.

Part of the electron bunch is lost whenever the electron bunch circulates through the electron storage ring 12. The electron bunch is therefore supplied from the electron supplier 11 to the electron storage ring 12 via the inflector 42 to compensate the lost electron bunch.

In the case where the full-width-at-half-maximum value of the length Lez of the electron bunch circulating through the electron storage ring 12 is configured to satisfy Expression (1a) described above, the full-width-at-half-maximum value of the pulse width of the EUV light generated by the undulator 14 ranges from about 0.3 to 3 ns.

Table 1 shows the relationship among the average current value of the electron bunch circulating through the electron storage ring 12, the length L of the undulator 14, and the power of the EUV light. Setting the average current value of the electron bunch at a value ranging from 10 to 20 A and the length L of the undulator 14 at a value ranging from 15 to 30 m allows generation of EUV light having a power ranging from 300 to 1200 W, as shown in Table 1.

TABLE 1

| Average current value of electron bunch | Length L of the undulator | Power of the EUV light |
|---|---|---|
| 10 A | 10 m | 300 W |
| 10 A | 30 m | 600 W |
| 15 A | 30 m | 900 W |
| 20 A | 30 m | 1200 W |

2.3 Effects

The EUV light generator 10a according to the first embodiment, in which the electron bunch that satisfies Expression (1) or (1a) described above passes through the undulator 14, generates EUV light having the pulse width ranging from about 0.3 to 10 ns or 0.3 to 3 ns as the full-width-at-half-maximum pulse width. As described above, since the EUV light output from the undulator 14 has a long pulse width and low coherency as compared with those in Comparative Example, the light transmission system 17a needs no optical element for expanding the pulse width, such as a grating. The EUV light generator 10a according to the first embodiment can therefore have improved EUV light transmission efficiency and supply EUV light that can suppress abrasion and speckles to the exposure apparatus 2 with only reflection loss produced at one off-axis paraboloid mirror 91.

2.4 High-Frequency Acceleration Cavity
2.4.1 Configuration

Figure 5:
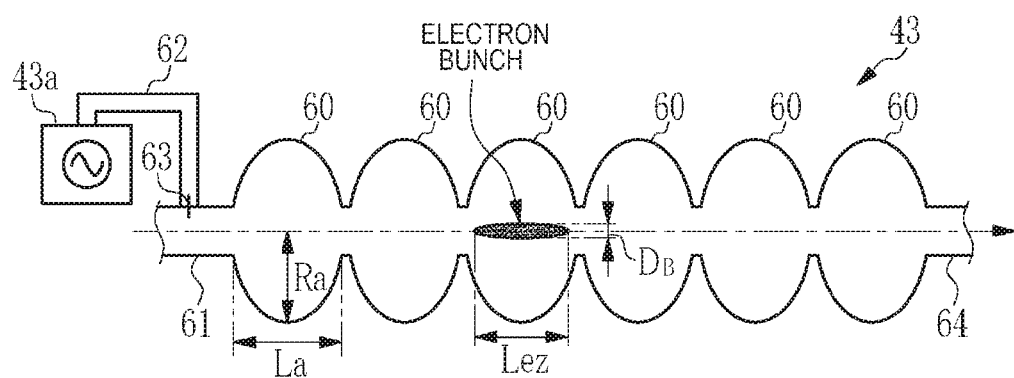
FIG. 5 shows a specific configuration of a high-frequency acceleration cavity 43 provided in the EUV light generator 10a according to the first embodiment.
Figure 6A:
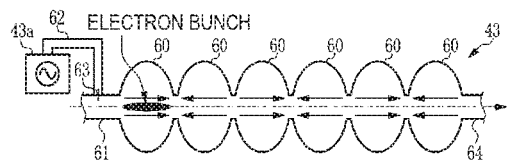
FIGS. 6A to 6F show the direction of an electric field resulting from a high frequency and movement of an electron bunch over time.
Figure 6B:
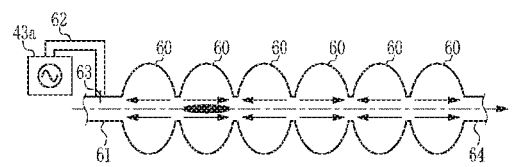
Figure 6C:
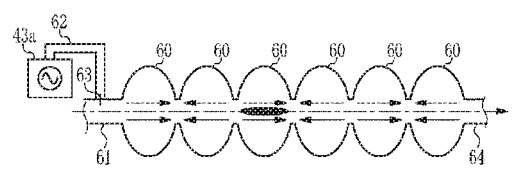
Figure 6D:
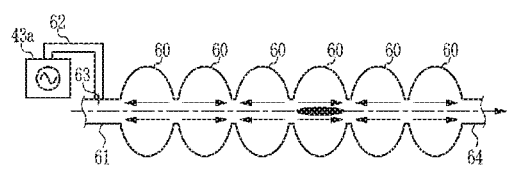
Figure 6E:
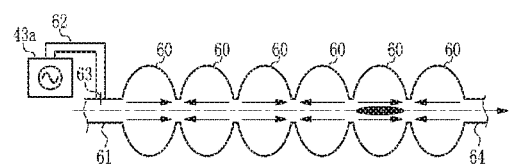
Figure 6F:
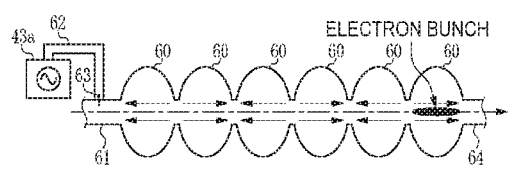

FIG. 5 shows a specific configuration of the high-frequency acceleration cavity 43 provided in the EUV light generator 10a according to the first embodiment. The high-frequency acceleration cavity 43 includes the plurality of cell cavities 60, an input tube 61, a waveguide tube 62, an input coupler 63, and an output tube 64, as shown in FIG. 5.

The cell cavities 60 are each a substantially spheroid. Let La be the diameter of each of the cell cavities 60 in the minor axis direction and Ra be the radius of each of the cell cavities 60 in the major axis direction. The above-mentioned length La of each of the cell cavities 60 corresponds to the diameter of the cell cavity 60 in the minor axis direction. The plurality of cell cavities 60 are so connected in series to each other that the minor axis direction thereof coincides with the traveling direction of the electron bunch. In FIG. 5, six cell cavities 60 are connected to each other, but the number of cell cavities 60 is not limited to six.

The input tube 61 is connected to one end of the series of cell cavities 60 linked to each other. The output tube 64 is connected to the other end of the series of cell cavities 60 linked to each other. The waveguide tube 62 is connected to the input tube 61 via the input coupler 63. The high-frequency power source 43a described above is connected to the waveguide tube 62. The high-frequency power source 43a applies voltage having a resonance frequency f0, which is the resonance frequency of the plurality of cell cavities 60, to the input tube 61.

The high-frequency acceleration cavity 43 may instead be a superconducting acceleration cavity. In this case, the cell cavities 60 are made of a high-purity niobium material and disposed in a cryo-module that is not shown but is maintained at an ultra-low temperature.

To cause the electron bunch having the full-width-at-half-maximum value of the length Lez to circulate through the electron storage ring 12, the cell cavities 60 may be configured to substantially satisfy La=2Lez, as described above. That is, the cell cavities 60 may be configured to satisfy Expression (3) or (3a) described above.

The resonance frequency f0 of the cell cavities 60 can be determined as follows: First, a resonance frequency λHF, at which the cell cavities 60 resonate in the $T_{010}$ mode, is expressed by Expression (4) below.

$$\lambda HF = 2.612 Ra[m] \quad (4)$$

The length La of each of the cell cavities 60 is expressed by Expression (5) below by using the relationship expressed by Expression (4) described above.

$$La = \lambda HF/2 = 1.306 Ra[m] \quad (5)$$

The resonance frequency f0 is expressed by Expression (6) below by using the relationship expressed by Expression (4) described above:

$$f0 = c/\lambda HF = 114.8/Ra[MHz] \quad (6)$$

where c represents the speed of light.

In the case where the length La of each of the cell cavities 60 satisfies Expression (3) described above, the resonance frequency f0 that falls within the range expressed by Expression (7) below is derived from Expressions (5) and (6) described above.

$$25 \text{ MHz} \leq f0 \leq 833 \text{ MHz} \quad (7)$$

In the case where the length La of each of the cell cavities 60 satisfies Expression (3a) described above, the resonance frequency f0 falls within the range expressed by Expression (7a) below.

$$83.3 \text{ MHz} \leq f0 \leq 833 \text{ MHz} \quad (7a)$$

2.4.2 Operation

The operation of the high-frequency acceleration cavity 43 will next be described. The controller 48 controls the high-frequency power source 43a to cause it to output electric power having the resonance frequency f0 described above, which is a high frequency. The high-frequency electric power is applied to the plurality of cell cavities 60 via the waveguide 62 and the input coupler 63 and causes the plurality of cell cavities 60 to resonate.

FIGS. 6A to 6F show the direction of an electric field resulting from the high frequency and movement of the electron bunch over time. The arrows shown in the cell cavities 60 show the direction of the electric field. The electron bunch passing through the cell cavities 60 are efficiently accelerated by the electric field in the cell cavities 60 under the condition that the speed of the electron bunch synchronizes with the temporal change in the electric field.

When the length La of each of the cell cavities 60 is so set as to satisfy Expressions (3) described above, the length Lez of the accelerated electron bunch satisfies Expression (1) described above. When the length La of each of the cell cavities 60 is so set as to satisfy Expressions (3a) described above, the length Lez of the accelerated electron bunch satisfies Expression (1a) described above.

2.5 Undulator
2.5.1 Configuration and Operation

Figure 7:
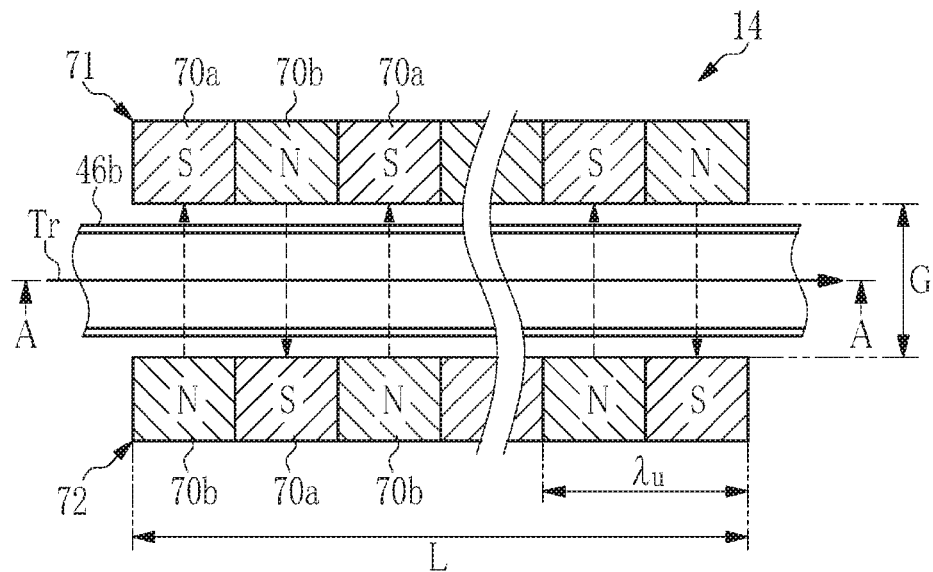
FIG. 7 is a longitudinal cross-sectional view of an undulator 14 taken along the traveling direction of the electron bunch.
Figure 8:
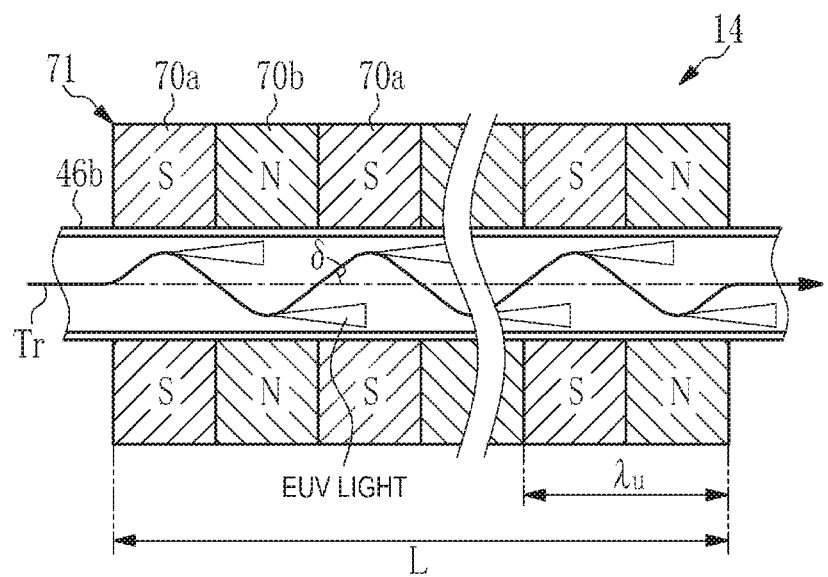
FIG. 8 is a lateral cross-sectional view of the undulator 14 taken along the line A-A in FIG. 7.

FIGS. 7 and 8 show a specific configuration of the undulator 14 provided in the EUV light generator 10a according to the first embodiment. FIG. 7 is a longitudinal cross-sectional view of the undulator 14 taken along the traveling direction of the electron bunch. FIG. 8 is a lateral cross-sectional view of the undulator 14 taken along the line A-A in FIG. 7.

The undulator 14 includes a first magnet row 71, which is disposed above the second linear section 46b of the tube 41, and a second magnet row 72, which is disposed below the second linear section 46b, as shown in FIG. 7. The first magnet row 71 and the second magnet row 72 have S poles 70a and N poles 70b alternately arranged. The S poles 70a in one of the first magnet row 71 and the second magnet row 72 face the N poles 70b in the other one of the first magnet row 71 and the second magnet row 72. Reference character Tr in FIGS. 7 and 8 represents the orbit of the electron bunch. Reference character $\lambda_u$ represents the magnetic field cycle length.

A gap G between the first magnet row 71 and the second magnet row 72 is determined in accordance with the wavelength of the EUV light generated by the undulator 14. A condition under which the gap G is determined will be described below. First, a parameter K representing the magnetic field produced by the first magnet row 71 and the second magnet row 72 is expressed by Expression (8) below.

$$K = eB_u \lambda_u / (2\pi m_e c) \quad (8)$$

where e represents the charge of an electron, $B_u$ represents a peak magnetic field, $m_e$ represents the rest mass of an electron, and c represents the speed of light in a vacuum.

The electron bunch travels along a sinusoidally serpentine orbit when passing through the magnetic field between the first magnet row 71 and the second magnet row 72 and outputs light in the form of radiation as shown in FIG. 8. The wavelength of the radiated light corresponds to a resonance wavelength $\lambda$ of the undulator 14 expressed by Expression (9) below.

$$\lambda = \lambda_u (2\gamma (1+K^2/2))^{-1/2} \quad (9)$$

Let $\delta$ be the inclination angle of the electron bunch that passes along the center axis of the undulator 14, and $\gamma$ is expressed by Expression (10) below.

$$\gamma = K/\delta \quad (10)$$

Expressions (8) to (10) described above show that changing the gap G between the first magnet row 71 and the second magnet row 72 changes the magnetic field and in turn the value of the parameter K, resulting in a change in the wavelength $\lambda$ of the radiated light. Therefore, to provide the EUV light as the radiated light, the gap G may be so changed that $\lambda=13.5$ nm is achieved to set the peak magnetic field $B_u$. The wavelength $\lambda$ can instead be set by changing the magnetic field cycle length $\lambda_u$.

The magnetic field cycle length $\lambda_u$ is so set as to fall within a range, for example, from 9 to 32 mm. The parameter K is set at a value smaller than 1 to allow the first magnet row 71 and the second magnet row 72 to function as an undulator.

2.6 Electron Generator
2.6.1 Configuration

Figure 9:
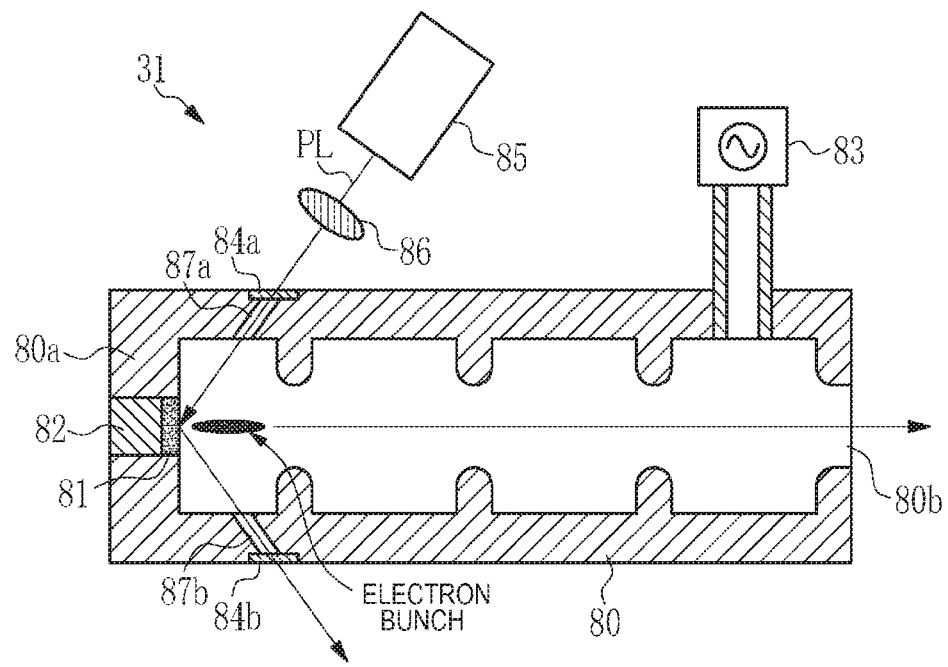
FIG. 9 shows a specific configuration of an electron generator 31 provided in the EUV light generator 10a according to the first embodiment.

FIG. 9 shows a specific configuration of the electron generator 31 provided in the EUV light generator 10a according to the first embodiment. The electron generator 31 includes a high-frequency cavity 80, the photocathode 81, a holder 82, a high-frequency power source 83, a first window 84a, a second window 84b, the pulsed laser apparatus 85, and a light collection lens 86, as shown in FIG. 9.

The high-frequency cavity 80 has one end where an end plate 80a is formed and the other end where an opening 80b is formed. The photocathode 81 is held by the holder 82, which is disposed at the center of the end plate 80a. The photocathode 81 is exposed to the internal space of the high-frequency cavity 80. The photocathode 81 is made, for example, of KCsTe.

A first through hole 87a and a second through hole 87b are formed in the high-frequency cavity 80. The first window 84a covers the first through hole 87a. The second window 84b covers the second through hole 87b.

The pulsed laser apparatus 85 outputs the ultraviolet pulsed laser light PL under the oscillation control of the controller 48 described above. In the case where the photocathode 81 is made of KCsTe, the pulsed laser apparatus 85 is preferably a pulsed laser apparatus that outputs pulsed laser light having a wavelength of 266 nm, which is the fourth harmonic of YAG laser light. The pulsed laser apparatus 85 may instead be a KrF excimer laser apparatus that outputs pulsed laser light having a wavelength of 248 nm.

The pulsed laser apparatus 85 is so disposed that the pulsed laser light PL is incident on the photocathode 81 via the light collection lens 86, the first window 84a, and the first through hole 87a. The second through hole 87b and the second window 84b are so disposed that the pulsed laser light PL reflected off the photocathode 81 passes through the second through hole 87b and the second window 84b and exits out of the high-frequency cavity 80.

The light collection lens 86 is so located as to collect the pulsed laser light PL into a spot on the photocathode 81. The light collection lens 86 only needs to be light collection optics that collects the pulsed laser light PL into a spot on the photocathode 81, and the focal point of the light collection lens 86 only needs to coincide with the photocathode 81.

The high-frequency cavity 80 is so configured that the full-width-at-half-maximum value of the length Lez of the electron bunch satisfies Expression (1) or (1a) described above. The high-frequency power source 83 is connected to the high-frequency cavity 80. The high-frequency power source 83 is so set under the control of the controller 48 described above as to accelerate the electron bunch at the resonance frequency of the high-frequency cavity 80.

2.6.2 Operation

The operation of the electron generator 31 will next be described. When a light emission trigger is input from the controller 48 to the pulsed laser apparatus 85, the pulsed laser apparatus 85 outputs the pulsed laser light PL. The pulsed laser light PL output from the pulsed laser apparatus 85 is collected by the light collection lens 86 into a spot on the photocathode 81 via the first window 84a and the first through hole 87a.

When irradiated with the pulsed laser light PL, the photocathode 81 generates the electron bunch in a photoelectric effect and outputs the electron bunch toward the opening 80b of the high-frequency cavity 80. The electron bunch is accelerated by the electric field in the high-frequency cavity 80. Adjusting the pulse width Wp of the pulsed laser light PL to fall within the range expressed by Expression (2) or (2a) allows the length Lez of the electron bunch to fall within the range expressed by Expression (1) or (1a).

2.7 Light Transmission System
2.7.1 Configuration

Figure 10:
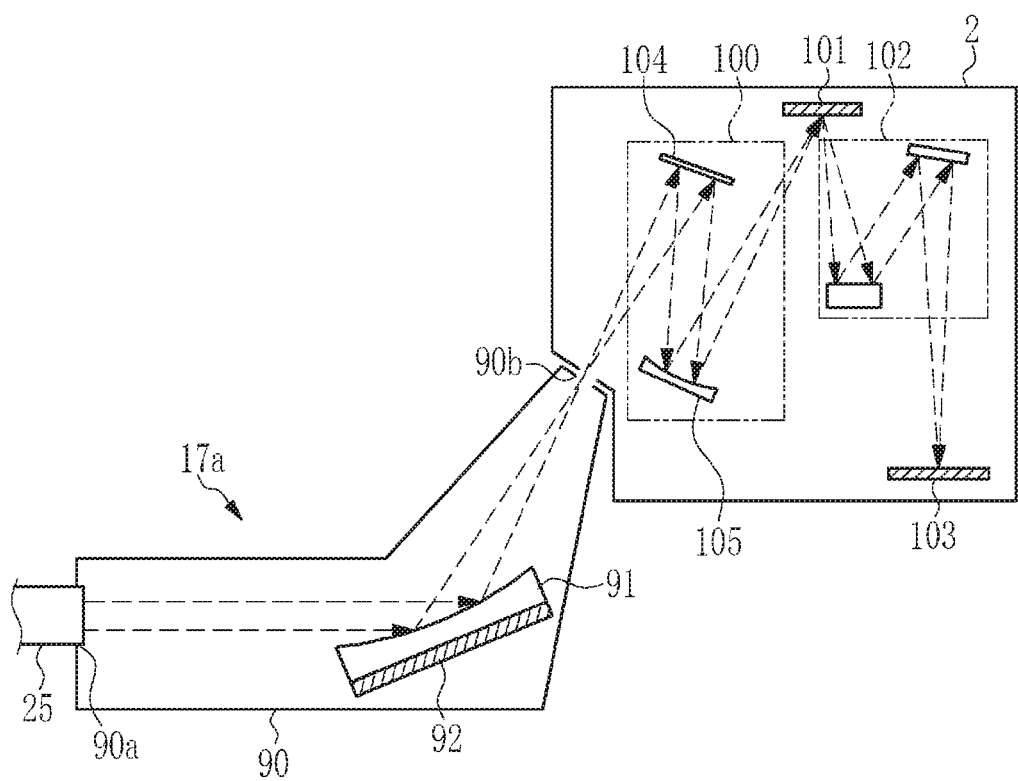
FIG. 10 shows a specific configuration of a light transmission system 17a provided in the EUV light generator 10a according to the first embodiment.

FIG. 10 shows a specific configuration of the light transmission system 17a provided in the EUV light generator 10a according to the first embodiment. The light transmission system 17a includes a chamber 90, an off-axis paraboloid mirror 91, and a holder 92, as shown in FIG. 10.

The off-axis paraboloid mirror 91 is so disposed in the chamber 90 that the EUV light output from an output portion of the light path tube 25 is incident on the off-axis paraboloid mirror 91 at a predetermined angle and the EUV light reflected off and collected by the off-axis paraboloid mirror 91 enters the exposure apparatus 2. The off-axis paraboloid mirror 91 is held by the holder 92.

An opening 90a is formed in a portion of the chamber 90 that is the portion to which the output portion of the light path tube 25 is connected. The output portion of the light path tube 25 and the opening 90a are sealably connected to each other via an O ring. A through hole 90b, through which the EUV light reflected off and collected by the off-axis paraboloid mirror 91 passes, is formed in the chamber 90. The portion between the through hole 90b and the input side of the exposure apparatus 2 is sealed by a seal member that is not shown. The interior of the chamber 90 is exhausted by an exhausting apparatus that is not shown to a state close to a vacuum so that attenuation of the EUV light is suppressed.

The exposure apparatus 2 includes illumination optics 100, a mask 101, projection optics 102, and a wafer 103. The illumination optics 100 is optics that generates illumination light with which the mask 101 is illuminated in the form of Keller illumination. The illumination optics 100 includes a concave multi-mirror 104, which includes a plurality of concave mirrors and generates a two-dimensional light source, and condenser optics 105, which is formed of a concave mirror.

2.7.2 Operation

The EUV light output from the undulator 14 is incident on the off-axis paraboloid mirror 91 in the chamber 90 via the light path tube 25 at a predetermined angle. The off-axis paraboloid mirror 91 reflects and collects the incident EUV light into a spot in the vicinity of the through hole 90b. The collected EUV light passes through the through hole 90b and enters the exposure apparatus 2. The EUV light having entered the exposure apparatus 2 is converted by the illumination optics 100 into the illumination light, and the surface of the mask 101 is uniformly illuminated with the illumination light. The illumination light reflected off the mask 101 transfers an image of the mask 101 onto the wafer 103 via the projection optics 102.

2.7.3 Effects

Since the full-width-at-half-maximum value of the pulse width of the EUV light that enters the chamber 90 from the undulator 14 falls within the range from about 0.3 to 10 ns, occurrence of abrasion at the off-axis paraboloid mirror 91 or the reflection surface of each optical element in the exposure apparatus 2 is suppressed. Further, occurrence of abrasion at a resist formed on the wafer 103 in the exposure apparatus 2 is suppressed. Moreover, since the coherency of the EUV light is lowered, occurrence of speckles is suppressed.

As described above, the light transmission system 17a, which includes only the off-axis paraboloid mirror 91 as an optical element, has improved EUV light transmission efficiency as compared with the light transmission system 17 according to Comparative Example shown in FIG. 2.

3. Second Embodiment

An EUV light generator 10b according to a second embodiment of the present disclosure will next be described. In the following description, substantially the same components as those of the EUV light generator 10a according to the first embodiment have the same reference characters and will not be described as appropriate.

3.1 Configuration

Figure 11:
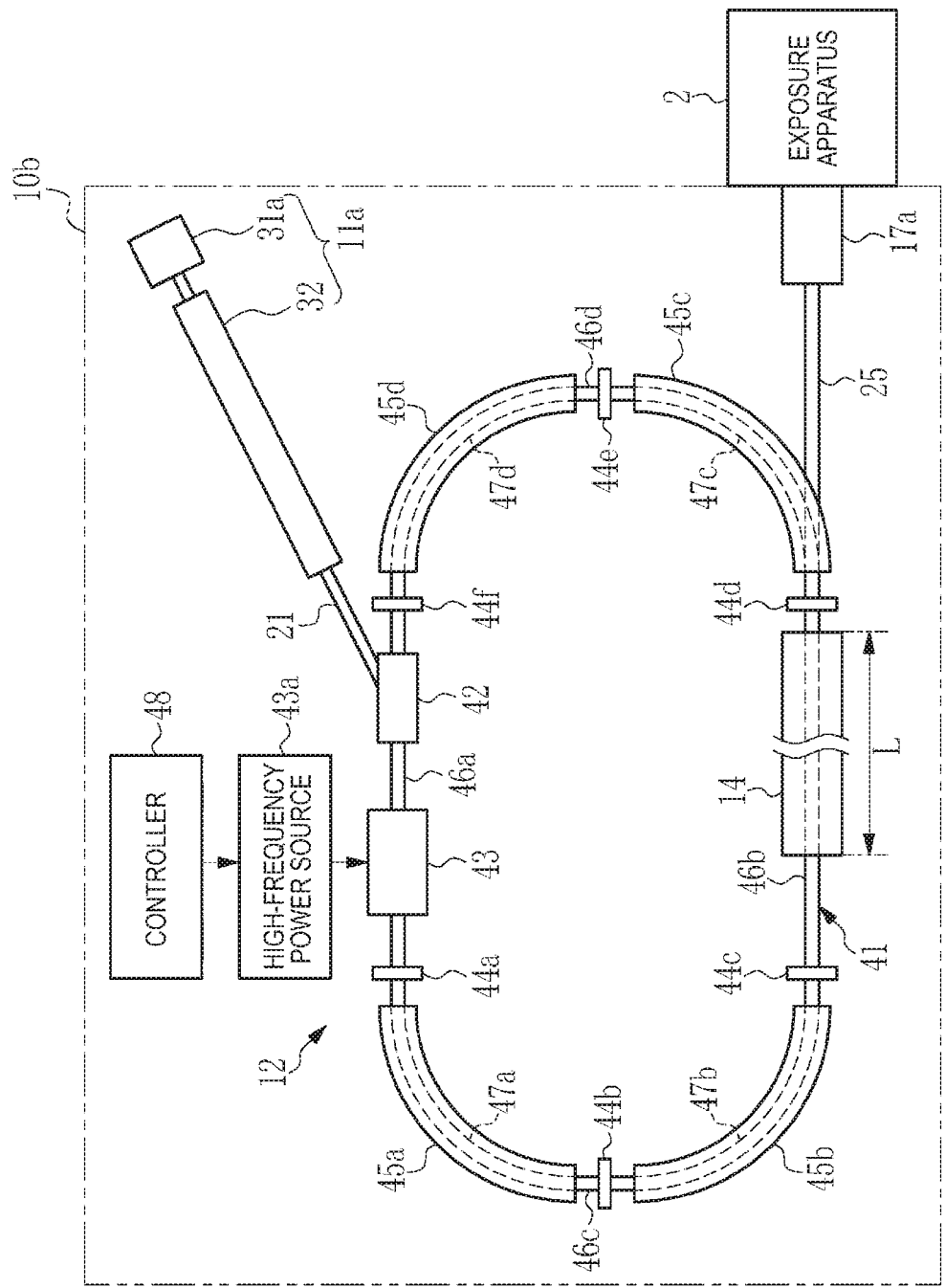
FIG. 11 shows the configuration of an EUV light generator 10b according to a second embodiment.

FIG. 11 shows the configuration of the EUV light generator 10b according to the second embodiment. The EUV light generator 10b has the same configuration as that of the EUV light generator 10a according to the first embodiment except that an electron supplier 11a includes an electron generator 31a having a configuration different from that in the first embodiment.

Figure 12:
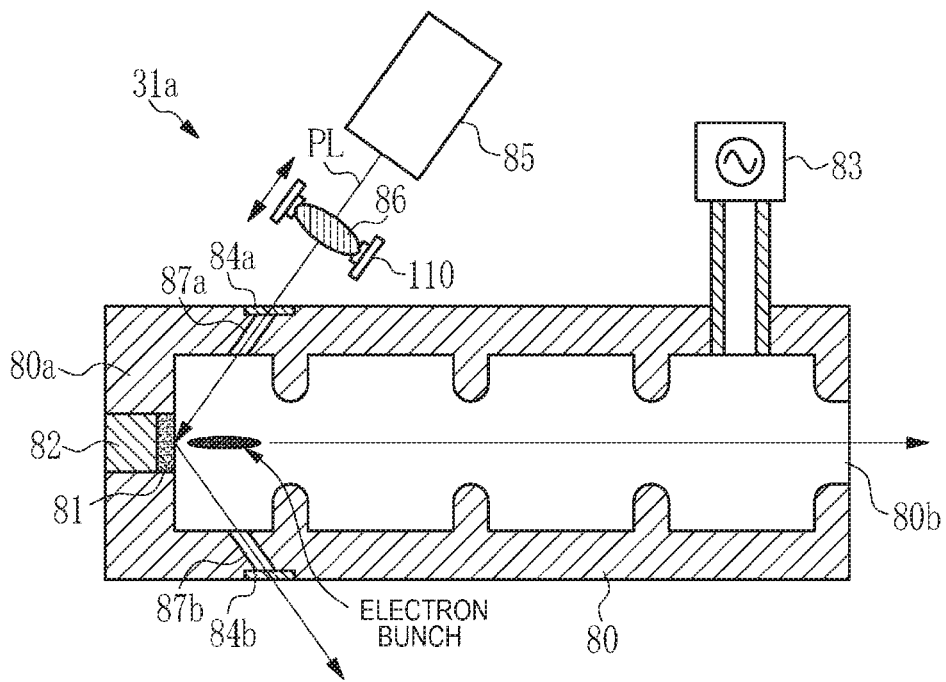
FIG. 12 shows the configuration of an electron generator 31a according to the second embodiment.

FIG. 12 shows the configuration of the electron generator 31a according to the second embodiment. The electron generator 31a has the same configuration as that of the electron generator 31 shown in FIG. 9 except that the electron generator 31a further includes a linear stage 110, which holds and moves the light collection lens 86. The linear stage 110 moves the light collection lens 86 along the optical axis of the pulsed laser light PL to change the position of the beam waist of the pulsed laser light PL along the optical path of the pulsed laser light PL under the control of the controller 48.

The electron generator 31a can change a collected light diameter $D_L$ of the collected pulsed laser light PL on the surface of the photocathode 81 by using the linear stage 110 to change the position of the light collection lens 86. A diameter $D_B$ of the electron bunch generated from the photocathode 81 in the direction perpendicular to the traveling direction of the electron bunch substantially coincides with the collected light diameter $D_L$.

The first to sixth convergence magnets 44a to 44f described above can adjust the magnetic force thereof to adjust the diameter $D_B$ of the electron bunch circulating through the electron storage ring 12.

The EUV light generated by the undulator 14 spatially spreads by the greater amount when the electron bunch has the larger diameter $D_B$ and therefore has lower spatial coherency. Controlling the position of the light collection lens 86 via the linear stage 110 therefore allows a change in the spatial coherency of the EUV light.

In general, a spread angle θ of the radiated light generated by one electron in the undulator 14 is expressed by Expression (11) below:

$$θ=(λ/(2L))^{-1/2} \tag{11}$$

where λ represents the wavelength of the radiated light, and L represents the length of the undulator 14.

A light source diameter $D_S$ corresponding to the diffraction limit associated with the radiated light radiated from one electron is expressed by Expression (12) below.

$$D_S=λ/(4π·θ) \tag{12}$$

In a case where λ=13.5 nm and L=20 m, θ=18.5×10$^{-6}$ [rad] and $D_S$=58.5 μm.

The diameter $D_B$ of the electron bunch is preferably set at a value calculated based on Expression (13) below along with the number N of light sources contained in the EUV light and the light source diameter $D_S$.

$$D_B=D_S·N^{-1/2} \tag{13}$$

In a case where the number N of light sources falls within the range expressed by Expression (14) below, the collected light diameter $D_L$ of the pulsed laser light PL may be so set at a value that falls within the range expressed by Expression (16) below that the diameter $D_B$ of the electron bunch falls within the range expressed by Expression (15) below.

$$25 \leq N \leq 10000 \tag{14}$$

$$300 \mu m \leq D_B \leq 6000 \mu m \tag{15}$$

$$300 \mu m \leq D_L \leq 6000 \mu m \tag{16}$$

In a case where the number N of light sources falls within the range expressed by Expression (14a) below, the collected light diameter $D_L$ of the pulsed laser light PL may be so set at a value that falls within the range expressed by Expression (16a) below that the diameter $D_B$ of the electron bunch falls within the range expressed by Expression (15a) below.

$$100 \leq N \leq 2500 \tag{14a}$$

$$600 \mu m \leq D_B \leq 3000 \mu m \tag{15a}$$

$$600 \mu m \leq D_L \leq 3000 \mu m \tag{16a}$$

3.2 Operation

The controller 48 controls the linear stage 110 to set the position of the light collection lens 86 in such a way that the collected light diameter $D_L$ of the pulsed laser light PL on the surface of the photocathode 81 satisfies Expression (16) or (16a) described above. Having set the position of the light collection lens 86, the controller 48 inputs the light emission trigger to the pulsed laser apparatus 85. When the photocathode 81 is irradiated with the pulsed laser light PL, an electron bunch having the diameter $D_B$ that satisfies Expression (15) or (15a) described above is generated.

The electron bunch is input from the electron supplier 11a into the tube 41 of the electron storage ring 12. The electron bunch circulates through the electron storage ring 12 with the first to sixth convergence magnets 44a to 44f maintaining the diameter $D_B$ at a value that satisfies Expression (15) or (15a) described above. When the electron bunch enters the undulator 14, the EUV light is generated. The diameter of the EUV light in the direction perpendicular to the traveling direction of the EUV light is substantially equal to the diameter $D_B$. The number N of light sources contained in the EUV light is a value that satisfies Expression (14) or (14a) described above.

3.3 Effects

The EUV light generator 10b according to the second embodiment can control the spatial coherency of the EUV light by setting the size of each of the light sources contained in the EUV light in a determined range in addition to the effects provided by the first embodiment. Lowering the spatial coherency of the EUV light allows further suppression of speckles.

3.4 Convergence Magnets
3.4.1 Configuration

Figure 13:
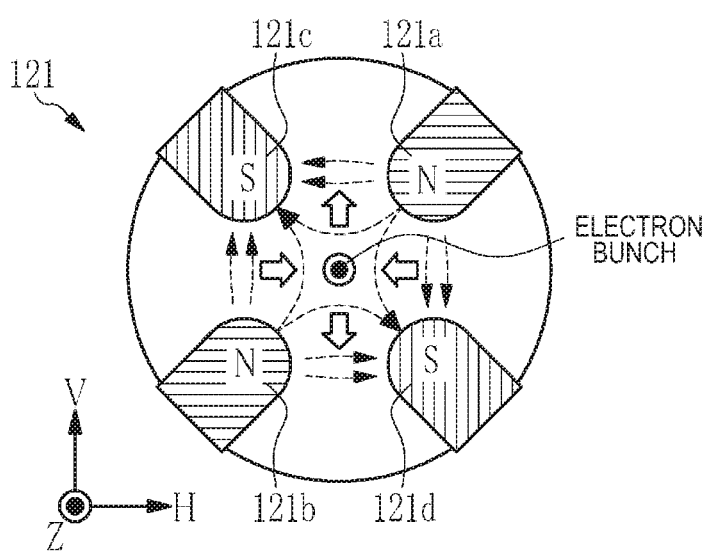
FIG. 13 shows the configuration of a first quadrupole magnet 121.
Figure 14:
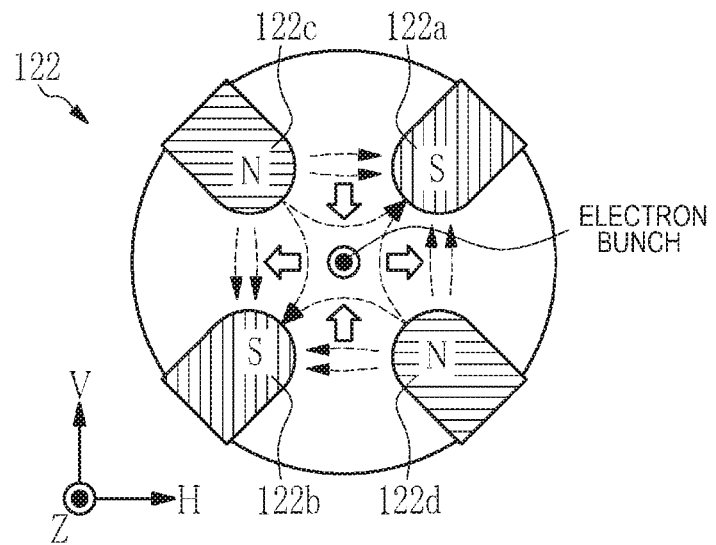
FIG. 14 shows the configuration of a second quadrature magnet 122.

FIGS. 13 and 14 show a first quadrupole magnet 121 and a second quadrupole magnet 122, which form each of the first to sixth convergence magnets 44a to 44f. A direction Z represents the traveling direction of the electron bunch. Directions V and H are directions perpendicular to each other in a plane perpendicular to the direction Z. Dotted-line arrows in FIGS. 13 and 14 represent the directions of the magnetic force.

The first quadrupole magnet 121 includes a first N pole 121a, a second N pole 121b, a first S pole 121c, and a second S pole 121d, as shown in FIG. 13. The first N pole 121a and the second N pole 121b face each other on the opposite sides of the portion, through which the electron bunch passes, in a plane perpendicular to the direction Z in the direction that inclines by 45° with respect to the direction V. The first S pole 121c and the second S pole 121d face each other on the opposite sides of the portion, through which the electron bunch passes, in the plane perpendicular to the direction Z in the direction that inclines by −45° with respect to the direction V.

The second quadrupole magnet 122 includes a first S pole 122a, a second S pole 122b, a first N pole 122c, and a second N pole 122d, as shown in FIG. 14. The first S pole 122a and the second S pole 122b face each other on the opposite sides of the portion, through which the electron bunch passes, in a plane perpendicular to the direction Z in the direction that inclines by 45° with respect to the direction V. The first N pole 122c and the second N pole 122d face each other on the opposite sides of the portion, through which the electron bunch passes, in the plane perpendicular to the direction Z in the direction that inclines by −45° with respect to the direction V.

The first quadrupole magnet 121 and the second quadrupole magnet 122 are disposed in series in the direction Z. The first quadrupole magnet 121 causes the electron bunch to converge in the direction H and causes the electron bunch to diverge in the direction V. The second quadrupole magnet 122 causes the electron bunch to converge in the direction V and causes the electron bunch to diverge in the direction H. The combination of the first quadrupole magnet 121 and the second quadrupole magnet 122 provides a convergence effect, such as an effect provided by the combination of a concave lens and a convex lens to cause light to converge.

Adjustment of the magnetic force produced by the first quadrupole magnet 121 and the second quadrupole magnet 122 allows adjustment of the convergence effect on the electron bunch. Specifically, adjustment of the gap between each set of magnets facing each other and adjustment of the gap between the first quadrupole magnet 121 and the second quadrupole magnet 122 allow adjustment of the convergence effect on the electron bunch. The magnetic force produced by the first quadrupole magnet 121 and the second quadrupole magnet 122 is so adjusted that the diameter $D_B$ of the electron bunch satisfies Expression (15) or (15a) described above in each of the directions H and V.

3.4.2 Operation

The electron bunch circulating through the electron storage ring 12 is caused by the first quadrupole magnet 121 to converge in the direction H and diverge in the direction V when the electron bunch passes through each of the first to sixth convergence magnets 44a to 44f. The electron bunch is further caused by the second quadrupole magnet 122 to converge in the direction V and diverge in the direction H. The electron bunch is thus so caused to converge that the diameter $D_B$ satisfies Expression (15) or (15a) described above in each of the directions H and V.

3.5 Variation of Electron Generator
3.5.1 Configuration

Figure 15:
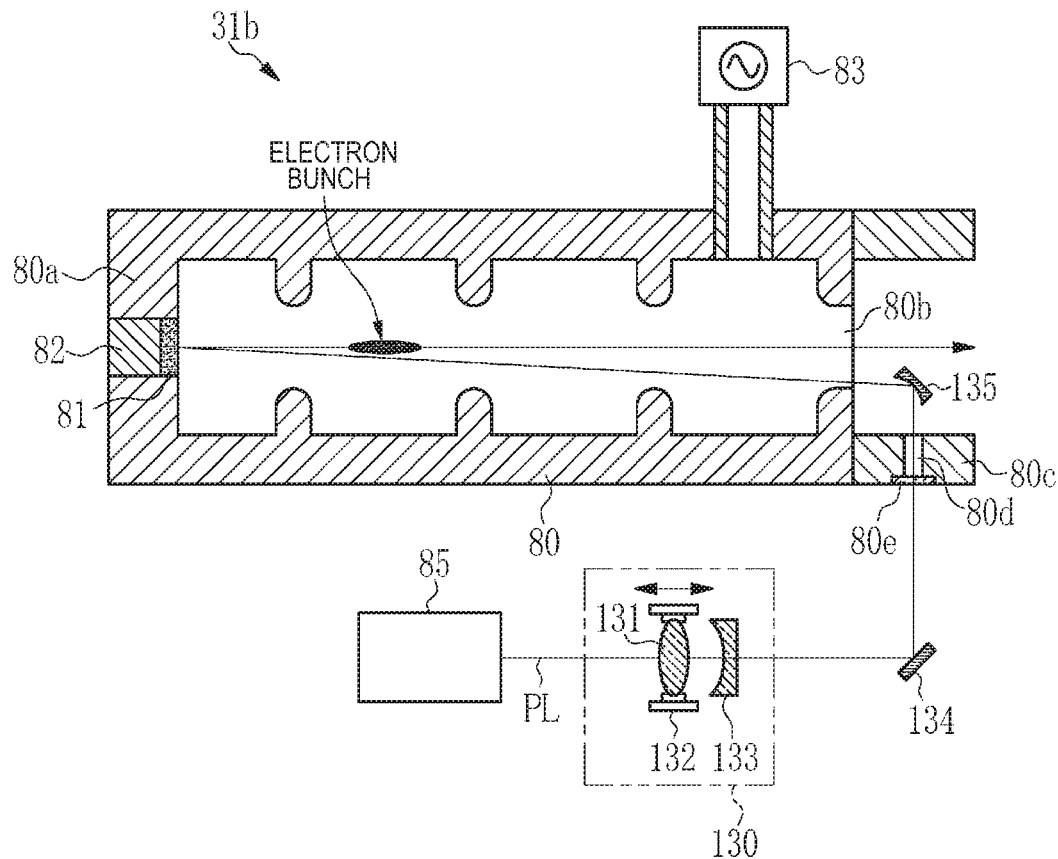
FIG. 15 shows a variation of the electron generator.

A variation of the electron generator 31a described in the second embodiment will next be shown. An electron generator 31b according to the variation includes a wavefront adjuster 130 in place of the light collection lens 86 and the linear stage 110 described above, as shown in FIG. 15. The wavefront adjuster 130 includes a convex lens 131, a linear stage 132, and a concave lens 133.

The linear stage 132 holds the convex lens 131 and moves it along the optical axis. The wavefront adjuster 130 changes the gap between the convex lens 131 and the concave lens 133 by moving the convex lens 131 to adjust the shape of the wavefront of the pulsed laser light PL output from the pulsed laser apparatus 85. Instead of the convex lens 131, the concave lens 133 may be held and moved by the linear stage 132.

No first through hole 87a, second through hole 87b, first window 84a, or second window 84b described above is provided in the high-frequency cavity 80 provided in the electron generator 31b. In place of the omitted components described above, a wall 80c is provided around the opening 80b of the high-frequency cavity 80, and a through hole 80d and a window 80e are provided in the wall 80c. The window 80e covers the through hole 80d.

The electron generator 31b further includes a high-reflectance mirror 134 and a concave mirror 135. The high-reflectance mirror 134 is so disposed as to reflect the pulsed laser light PL having been output from the pulsed laser apparatus 85 and having passed through the wavefront adjuster 130 and guide the reflected pulsed laser light PL to the window 80e. The concave mirror 135 is so disposed as to reflect the pulsed laser light PL having passed through the window 80e and the through hole 87a and collect the reflected pulsed laser light PL into a spot on the photocathode 81 via the opening 80b. The concave mirror 135 may instead be an off-axis paraboloid mirror.

3.5.2 Operation

The controller 48 controls the linear stage 132 to change the gap between the convex lens 131 and the concave lens 133 to adjust the shape of the wavefront of the pulsed laser light PL for adjustment of the collected light diameter $D_L$ of the pulsed laser light PL on the surface of the photocathode 81. The collected light diameter $D_L$ of the pulsed laser light PL is so adjusted as to satisfy Expression (16) or (16a) described above.

3.5.3 Effects

In the electron generator 31b, since the pulsed laser light PL is collected into a spot on the photocathode 81 via the opening 80b of the high-frequency cavity 80, the pulsed laser light PL is incident on the surface of the photocathode 81 substantially at right angles. The shape of the collected pulsed laser light PL on the surface of the photocathode 81 is therefore close to a circular shape, whereby the range over which the collected light diameter $D_L$ is adjusted widens.

4. Third Embodiment

An EUV light generator 10c according to a third embodiment of the present disclosure will next be described. In the following description, substantially the same components as those of the EUV light generator 10a according to first embodiment have the same reference characters and will not be described as appropriate.

4.1 Configuration

Figure 16:
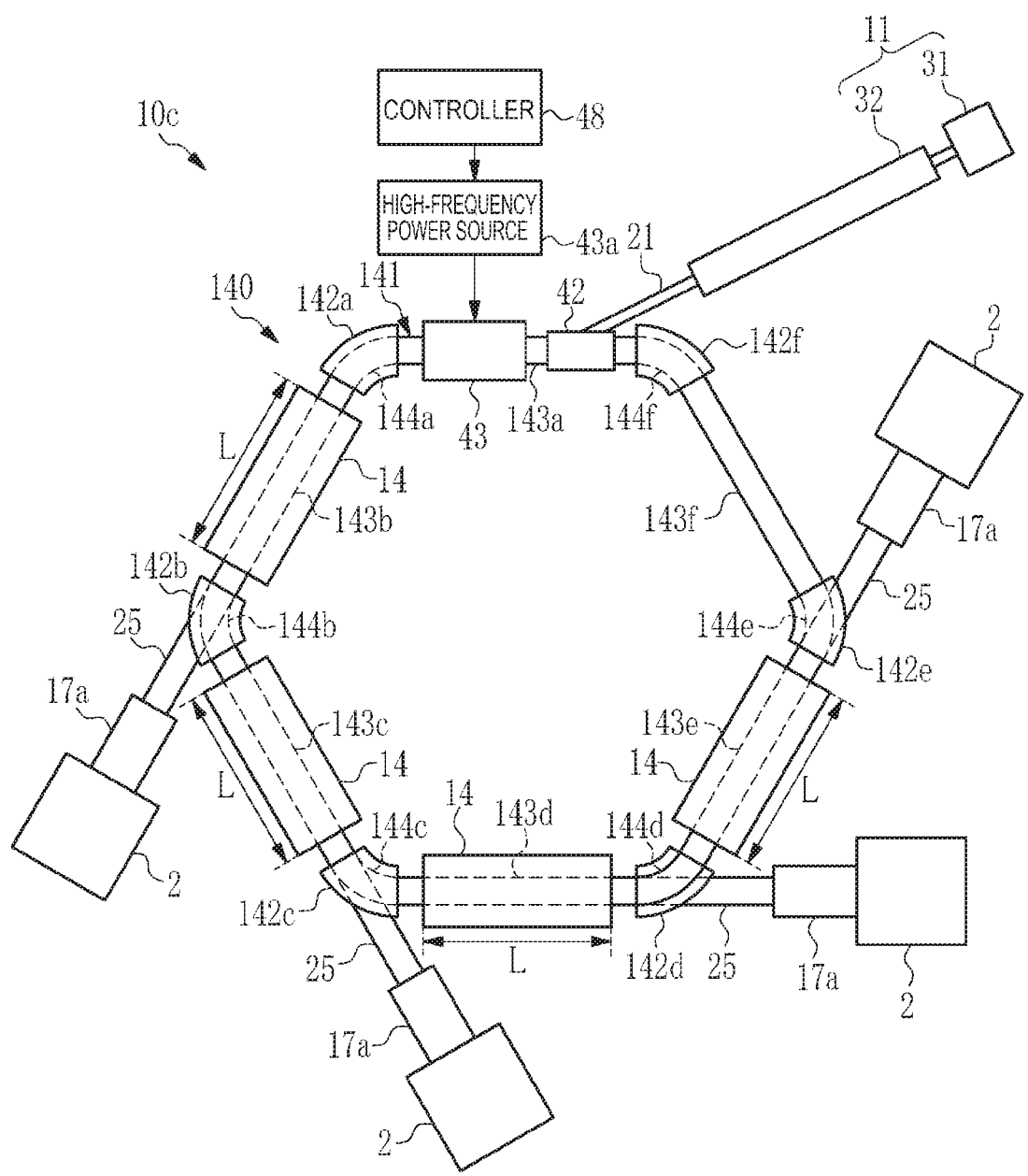
FIG. 16 schematically shows the configuration of an EUV light generator 10c according to a third embodiment.

FIG. 16 schematically shows the configuration of the EUV light generator 10c according to the third embodiment. The EUV light generator 10c includes the electron supplier 11, an electron storage ring 140, four undulators 14, four light transmission systems 17a, as shown in FIG. 16. The electron supplier 11, the undulators 14, and the light transmission systems 17a have the same configurations as those in the first embodiment. The electron supplier 11 may be replaced with the electron supplier 11a according to the second embodiment.

The electron storage ring 140 includes a tube 141, the inflector 42, the high-frequency acceleration cavity 43, and first to sixth deflection magnets 142a to 142f. The tube 141 has a substantially hexagonal ring shape including first to sixth linear sections 143a to 143f and first to sixth curved sections 144a to 144f.

The first curved section 144a is connected to the first linear section 143a and the second linear section 143b therebetween. The second curved section 144b is connected to the second linear section 143b and the third linear section 143c therebetween. The third curved section 144c is connected to the third linear section 143c and the fourth linear section 143d therebetween. The fourth curved section 144d is connected to the fourth linear section 143d and the fifth linear section 143e therebetween. The fifth curved section 144e is connected to the fifth linear section 143e and the sixth linear section 143f therebetween. The sixth curved section 144f is connected to the sixth linear section 143f and the first linear section 143a therebetween.

The inflector 42 and the high-frequency acceleration cavity 43 have the same configurations as those in the first embodiment and are disposed in the first linear section 143a. The first to sixth deflection magnets 142a to 142f are disposed in the first to sixth curved section 144a to 144f, respectively. The undulators 14 are disposed in the second to fifth linear sections 143b to 143e. The optical path tubes 25 are connected to the output ends of the second to fifth linear sections 143b to 143e. The exposure apparatuses 2 are connected to the output ends of the light path tubes 25 via the respective light transmission systems 17a, as in the first embodiment.

The length L of each of the undulators 14 falls within the range that satisfies Expression (4) described above. The high-frequency acceleration cavity 43 is so configured that the full-width-at-half-maximum value of the length Lez of the electron bunch circulating through the electron storage ring 140 satisfies Expression (1) or (1a) described above, as in the first embodiment. The other configurations in the variation is the same as those in the first embodiment. Here, the EUV light generator 10c may be disposed below the ground, and the exposure apparatuses 2 may be disposed above the ground.

4.2 Operation

The electron bunch is supplied from the electron supplier 11 to the electron storage ring 140 and circulates through the electron storage ring 140, as in the first embodiment. When the electron bunch enters each of the undulators 14 disposed in the electron storage ring 140, the electron bunch generates the EUV light. The full-width-at-half-maximum value of the pulse width of the EUV light ranges from about 0.3 to 10 ns. The EUV light generated by each of the undulators 14 enters the corresponding exposure apparatus 2 via the corresponding light path tube 25 and light transmission system 17a.

4.3 Effects

The EUV light generator 10c according to the third embodiment, in which the undulators 14 are provided in the plurality of linear sections of the electron storage ring 140, can supply the plurality of exposure apparatuses 2 with the EUV light. As a result, the size of the EUV light generator that supplies the plurality of exposure apparatuses with the EUV light can be reduced.

4.4 Variations

In the EUV light generator 10c according to the third embodiment, no undulator 14 is provided in the sixth linear section 143f. Instead, the undulator 14 may be provided in the sixth linear section 143f, and the light path tube 25, the light transmission system 17a, and the exposure apparatus 2 may be connected to the sixth linear section 143f. Further in the third embodiment, the electron storage ring 40 has a substantially hexagonal ring shape, but not necessarily, and may only be required to have a substantially polygonal shape. In the third embodiment, in which the convergence magnets are omitted, the same convergence magnets as those in the embodiments described above may be provided.

In each of the embodiments described above, the undulator 14 is configured to generate the EUV light having the wavelength of 13.5 nm, but not necessarily. For example, EUV light having a wavelength of 6.7 nm can also be generated by adjusting the magnetic force produced by the undulator 14.

The above description is intended not to be limiting but merely to be exemplary. It will therefore be apparent for a person skilled in the art that the embodiments of the present disclosure can be changed without departing from the accompanying claims.

The terms used in the entire specification and accompanying claims should each be construed as a "non-limiting" term. For example, the term "include" or "included" should be construed as "does not necessarily include only what is described." The term "have" should be construed as "does not necessarily have only what is described." Further, an indefinite article "a" described in the present specification and the accompanying claims should be construed as a term that means "at least one" or "one or more."

What is claimed is:

1. An EUV light generator comprising:
an electron storage ring including a first linear section and a second linear section;
an electron supplier configured to supply the electron storage ring with an electron bunch;
a high-frequency acceleration cavity disposed in the first linear section and configured to accelerate the electron bunch in such a way that a length Lez of the electron bunch satisfies Expression (a) below:

$$0.09\ m \leq Lez \leq 3\ m \quad \text{(a); and}$$

an undulator disposed in the second linear section and configured to output EUV light when the electron bunch enters the undulator,
wherein the electron supplier includes:
a pulsed laser apparatus configured to output pulsed laser light;
light collection optics configured to collect the pulsed laser light; and
a photocathode configured to generate the electron bunch when the pulsed laser light collected by the light collection optics is incident on the photocathode; and
wherein a collected light diameter $D_L$ of the pulsed laser light on a surface of the photocathode satisfies Expression (g) below;

$$300\ \mu m\ D_L \leq 6000\ \mu m \quad \text{(g).}$$

2. The EUV light generator according to claim 1, wherein the high-frequency acceleration cavity accelerates the electron bunch in such a way that the length Lez of the electron bunch satisfies Expression (b) below:

$$0.09\ m \leq Lez \leq 0.9\ m \quad \text{(b).}$$

3. The EUV light generator according to claim 2, wherein the high-frequency acceleration cavity includes a plurality of cell cavities having substantially a same length, and
a length La of each of the cell cavities satisfies Expression (c) below:

$$0.18\ m \leq La \leq 1.8\ m \quad \text{(c).}$$

4. The EUV light generator according to claim 2, wherein a current value of the electron bunch circulating through the electron storage ring ranges from 10 to 20 A.

5. The EUV light generator according to claim 1, wherein a length L of the undulator satisfies Expression (d) below:

$$15\ m \leq L \leq 30\ m \quad \text{(d).}$$

6. The EUV light generator according to claim 1, wherein a pulse width Wp of the pulsed laser light satisfies Expression (e) below:

$$0.3\ ns \leq Wp \leq 10\ ns \quad \text{(e).}$$

7. The EUV light generator according to claim 1, wherein a pulse width Wp of the pulsed laser light satisfies Expression (f) below:

$$0.3\ ns \leq Wp \leq 3\ ns \quad \text{(f).}$$

8. The EUV light generator according to claim 1, wherein a collected light diameter $D_L$ of the pulsed laser light on a surface of the photocathode satisfies Expression (h) below:

$$600\ \mu m \leq D_L \leq 3000\ \mu m \quad \text{(h).}$$

9. The EUV light generator according to claim 1, wherein the light collection optics includes a light collection lens and a linear stage that holds the light collection lens and moves the light collection lens along an optical axis of the light collection optics, and
a collected light diameter of the pulsed laser light on a surface of the photocathode is adjustable by controlling the linear stage to move the light collection lens.

10. The EUV light generator according to claim 1, wherein the high-frequency acceleration cavity disposed in the first linear section and configured to accelerate the electron bunch and include a plurality of cell cavities having substantially a same length, with a length La of each of the cell cavities satisfying Expression (k) below:

$$0.18\ m \leq La \leq 6\ m \quad \text{(k).}$$

11. An EUV light generator comprising:
an electron storage ring including a first linear section and a second linear section;
an electron supplier configured to supply the electron storage ring with an electron bunch;
a high-frequency acceleration cavity disposed in the first linear section and configured to accelerate the electron bunch in such a way that a length Lez of the electron bunch satisfies Expression (a) below:

$$0.09\ m \leq Lez \leq 3\ m \quad \text{(a); and}$$

an undulator disposed in the second linear section and configured to output EUV light when the electron bunch enters the undulator,
wherein the electron supplier includes:
a pulsed laser apparatus configured to output pulsed laser light,
light collection optics configured to collect the pulsed laser light, and
a photocathode configured to generate the electron bunch when the pulsed laser light collected by the light collection optics is incident on the photocathode,
wherein the light collection optics includes a wavefront adjuster configured to adjust a shape of a wavefront of the pulsed laser light output from the pulsed laser apparatus, and
wherein a collected light diameter of the pulsed laser light on a surface of the photocathode is adjustable by controlling the wavefront adjuster to adjust the shape of the wavefront.

12. The EUV light generator according to claim 11, wherein the wavefront adjuster includes a convex lens and a concave lens disposed along an optical axis of the pulsed laser light, and
adjusting a gap between the convex lens and the concave lens allows adjustment of the collected light diameter.

13. The EUV light generator according to claim 12, wherein the light collection optics includes a linear stage configured to hold and move one of the convex lens and the concave lens.

14. An EUV light generator comprising:
an electron storage ring including a first linear section and a second linear section;
an electron supplier configured to supply the electron storage ring with an electron bunch; a high-frequency acceleration cavity disposed in the first linear section and configured to accelerate the electron bunch in such a way that a length Lez of the electron bunch satisfies Expression (a) below:

$$0.09\ m \leq Lez \leq 3\ m \quad \text{(a); and}$$

an undulator disposed in the second linear section and configured to output EUV light when the electron bunch enters the undulator, wherein a diameter $D_B$ of the electron bunch in a direction perpendicular to a traveling direction of the electron hunch satisfies Expression (i) below:

$$300\ \mu m \leq D_B \leq 6000 \mu m \quad \text{(i)}$$

15. The EUV light generator according to claim 14, wherein a diameter $D_B$ of the electron bunch in a direction perpendicular to a traveling direction of the electron bunch satisfies Expression (j) below:

$$600 \mu m \leq D_B \leq 3000 \mu m \quad \text{(j)}$$

* * * * *